(12) United States Patent
Casale

(10) Patent No.: US 12,126,391 B2
(45) Date of Patent: Oct. 22, 2024

(54) RADIO FREQUENCY DETECTOR FOR TEST CHAMBER

(71) Applicant: Communications Test Design, Inc., West Chester, PA (US)

(72) Inventor: Paul Casale, West Chester, PA (US)

(73) Assignee: Communications Test Design, Inc., West Chester, PA (US)

( * ) Notice: Subject to any disclaimer, the term of this patent is extended or adjusted under 35 U.S.C. 154(b) by 132 days.

(21) Appl. No.: 17/705,685

(22) Filed: Mar. 28, 2022

(65) Prior Publication Data

US 2023/0308194 A1 Sep. 28, 2023

(51) Int. Cl.
*H04B 17/00* (2015.01)
*G01R 19/165* (2006.01)
*G01R 29/10* (2006.01)
*H04B 17/23* (2015.01)

(52) U.S. Cl.
CPC ....... *H04B 17/23* (2015.01); *G01R 19/16576* (2013.01); *G01R 29/105* (2013.01)

(58) Field of Classification Search
CPC ...... H04B 17/23; H04B 17/18; H04B 17/296; G01R 19/16576; G01R 29/105; G01R 31/3025
See application file for complete search history.

(56) References Cited

U.S. PATENT DOCUMENTS

| | | |
|---|---|---|
| 4,800,387 A | 1/1989 | Joy |
| 6,114,985 A | 9/2000 | Russell et al. |
| 8,412,111 B2 | 4/2013 | Talwar et al. |
| 9,551,761 B2* | 1/2017 | McCollough, Jr. ........... G01R 33/0206 |
| 10,637,589 B1* | 4/2020 | Chakraborty ........ H04B 17/318 |
| 2013/0281036 A1 | 10/2013 | Kolokotronis |
| 2015/0102225 A1* | 4/2015 | Sertel ................. G01N 21/3581 250/341.5 |
| 2019/0230749 A1 | 7/2019 | Leindecker et al. |
| 2019/0331719 A1 | 10/2019 | Cummings |
| 2020/0256911 A1* | 8/2020 | Lang ...................... G01R 27/28 |

FOREIGN PATENT DOCUMENTS

| | | |
|---|---|---|
| CN | 212379751 U * | 1/2021 |
| WO | 2021060558 A1 | 4/2021 |

OTHER PUBLICATIONS

Carobbi, "EMC Measurements. Modern Measurements: Fundamentals and Applications" Chapter 10. Publication [online]. Sep. 12, 2015 [retrieved Jun. 14, 2023]. [URL: https://onlinelibrary.wiley.com/doi/10.1002/9781119021315.ch1 OJ.

Chun, et al., "Wide Power Dynamic Range CMOS RF-DC Rectifier for RF Energy Harvesting System: A Review"; IEEE Access, vol. 10; 07 Publication [online]. Mar. 8, 2022 [retrieved Aug. 2023]. Retrieved from the Internet: [URL: https://ieeexplore.ieee.org/document/9722868].

International Search Report and Written Opinion for PCT/US2023/016496 issued Oct. 6, 2023, 13 pages.

* cited by examiner

*Primary Examiner* — Tuan Pham
(74) *Attorney, Agent, or Firm* — Duane Morris LLP

(57) ABSTRACT

Radio frequency detection circuitry includes a radio frequency (RF) emitting device; a waveguide to receive RF energy emitted by the RF emitting device; a power detector to convert RF energy received by the waveguide to a voltage; and a safety device that operates if a threshold voltage is detected at the power detector.

12 Claims, 3 Drawing Sheets

RADIO FREQUENCY DETECTOR FOR TEST CHAMBER

BACKGROUND

The present disclosure relates to a radio frequency (RF) detector for a test chamber. More specifically, the present invention relates to a providing a safety feature when a millimeter wave test chamber is in operation.

Anechoic chambers are used for testing radios, antennas, instrumentation, and other communications equipment, for example fifth generation (5G) new radios (NR) that operate in the 29 GHz and 39 GHz frequency bands. While the radios are transmitting RF energy, there is a safety risk if someone was to open the door to the anechoic test chamber while the RF is transmitting. A person can be unwillingly or accidentally exposed to RF radiation if the door to the anechoic test chamber is inadvertently opened during testing. High levels of RF power can cause soft tissue damage. The purpose of the RF Detector is to detect the RF Energy and initiate a safety features such as locking a door to the test chamber or illuminating a warning sign on the outside of the chamber that indicates that there is RF presently transmitting.

SUMMARY OF THE INVENTION

To overcome the problems described above, preferred embodiments of the present disclosure provide radio frequency detection circuitry including a radio frequency (RF) emitting device; a waveguide to receive RF energy emitted by the RF emitting device; a power detector to convert RF energy received by the waveguide to a voltage; and a safety device that operates if a threshold voltage is detected at the power detector.

The radio frequency detection circuitry can further include a voltage reader that reads the voltage at the power detector or a processor that reads the voltage at the voltage reader and signals the safety device to operate.

The safety device can be an illuminated sign. The voltage reader can be a multimeter.

In another embodiment, a circuit determines if a threshold level of radio frequency (RF) energy is being emitted from a RF emitting device and operates a safety device if the threshold has been met.

In another embodiment, a radio frequency detector for a millimeter wave test chamber includes a radio frequency (RF) detector circuit that samples RF energy provided by a waveguide routing the RF energy from a RF emitting device and outputs a voltage to a voltage reader; a processor that monitors the voltage and operates a safety device outside of the test chamber indicating that RF energy is being transmitted.

The waveguide can be a SH128-20 WR 28 Waveguide with UG-599/U Flange. The RF detector circuit can be a LTC5596 Development Board. The voltage reader can be a multimeter.

The above and other features, elements, characteristics, steps, and advantages of the present invention will become more apparent from the following detailed description of preferred embodiments of the present invention with reference to the attached drawings.

DETAILED DESCRIPTION OF PREFERRED EMBODIMENTS

Figure 1:
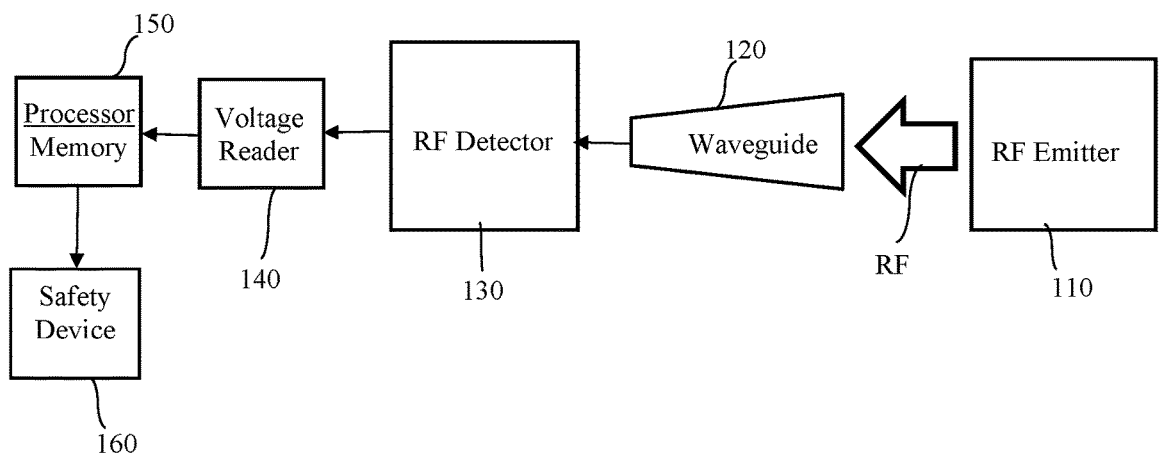
FIG. 1 is a block diagram of RF detector circuitry according to an embodiment of the present disclosure.

FIG. 1 is a block diagram of RF detector circuitry 100 according to an embodiment of the present disclosure. FIG. 1 shows an RF emitter 110 located in an anechoic test chamber that, when operational or being tested, emits an unsafe level of RF energy RF. The RF energy RF is directed to a waveguide 120 that collects and directs the emitted RF energy RF to a RF detector 130. The RF detector 130 samples the RF directed by the waveguide 120 and outputs a voltage that is proportional to the RF energy RF to a voltage reader 140. The voltage read by the voltage reader 140 is monitored by a program run by a processor and associated memory 150. If the voltage read is greater than a threshold indicating that RF energy is being transmitted by the RF emitter 110, then the program run on the processor implements a safety device 160. If the voltage level is below the threshold or the testing is stopped, then the safety device is disabled or turned off.

Figure 2:
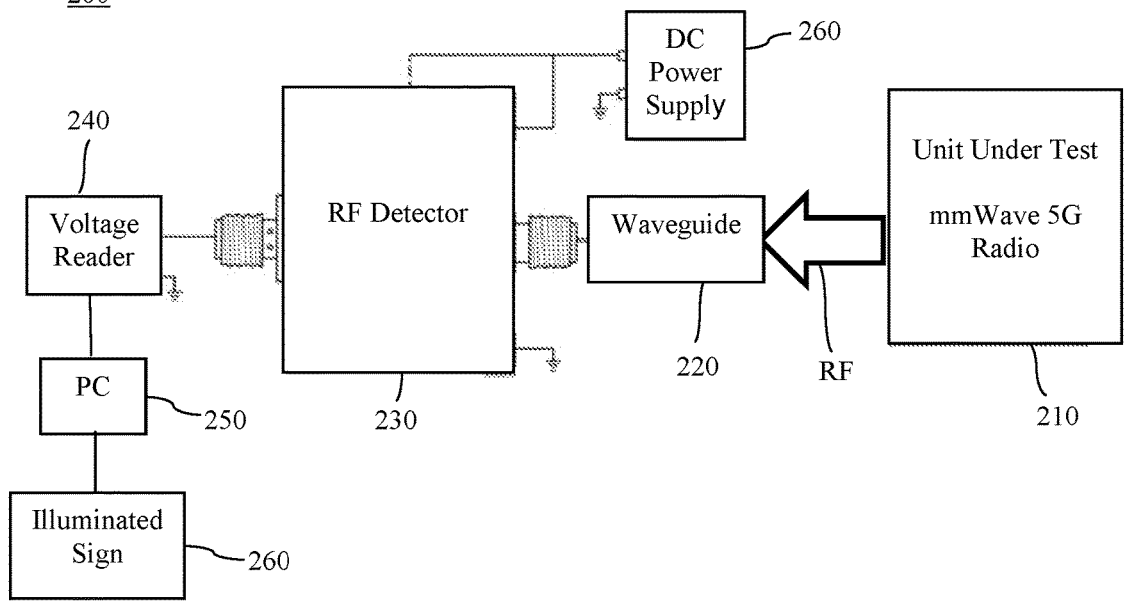
FIG. 2 is a block diagram of RF detector circuitry according to another embodiment of the present disclosure.
Figure 3:
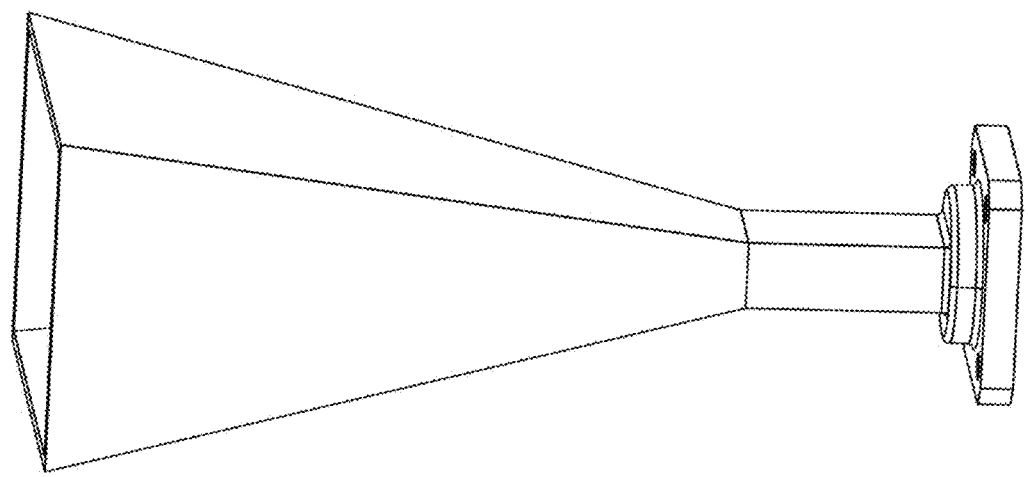
FIG. 3 is an image of a waveguide.
Figure 4:
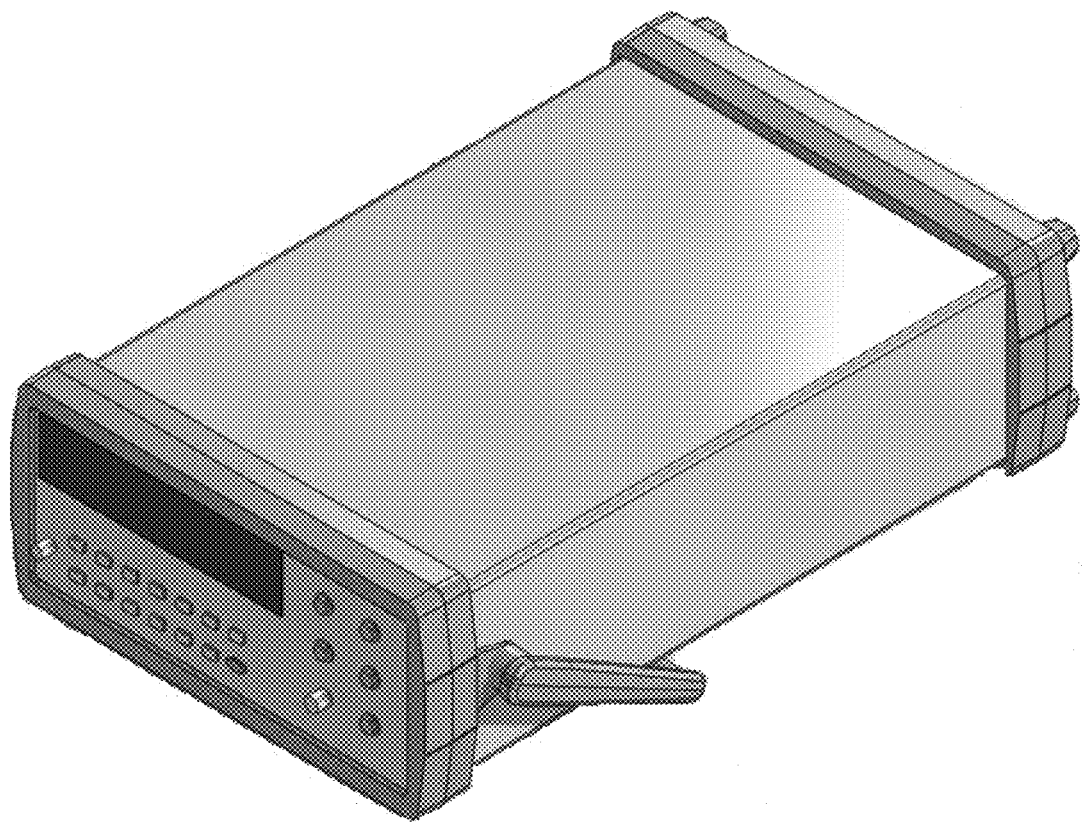
FIG. 4 is an image of a voltage reader.

FIG. 2 is a diagram of RF detection circuitry 200 according to an embodiment of the present disclosure. FIG. 2 shows a unit under test 210 emitting RF energy RF to a waveguide 220. The waveguide can be a SH128-20 WR-28 Waveguide With UG-599/U Square Cover Flange or equivalent, similar to that shown in FIG. 3. The waveguide 220 transmits the RF energy to a RF detector 230. As shown, the RF detector 230 can be a LTC5596 Development Board, RMS Power Detector featuring the LTC5596 IC or equivalent and powered by a DC power supply 260. The RF detector 230 can output a voltage that is proportional to the RF energy RF to a voltage reader 240. The voltage reader 240 can be a Fluke® model 8846 Digital Multimeter or equivalent, similar to that shown in FIG. 4.

Software running on a personal computer 250 can monitor the voltage read by the voltage reader 240. If the voltage read is greater than 0.06V, for example, indicating that RF energy is being emitted, the PC 250 can turn on a variable AC power supply that powers an illuminated warning sign located on the outside of the anechoic chamber that displays that RF energy presently transmitting in the test chamber. Optionally, the safety feature can be locking a door to the test chamber, flashing a light, an audible alarm, or any other suitable method or feature so that someone can determine that there is RF energy transmitting in the test chamber or is otherwise prevented from entering the test chamber while RF energy is being transmitted.

Optionally, a multiplexer or switch can be included in the circuitry such that a processor or computer can control multiple safety features or indicators.

Figure 5:
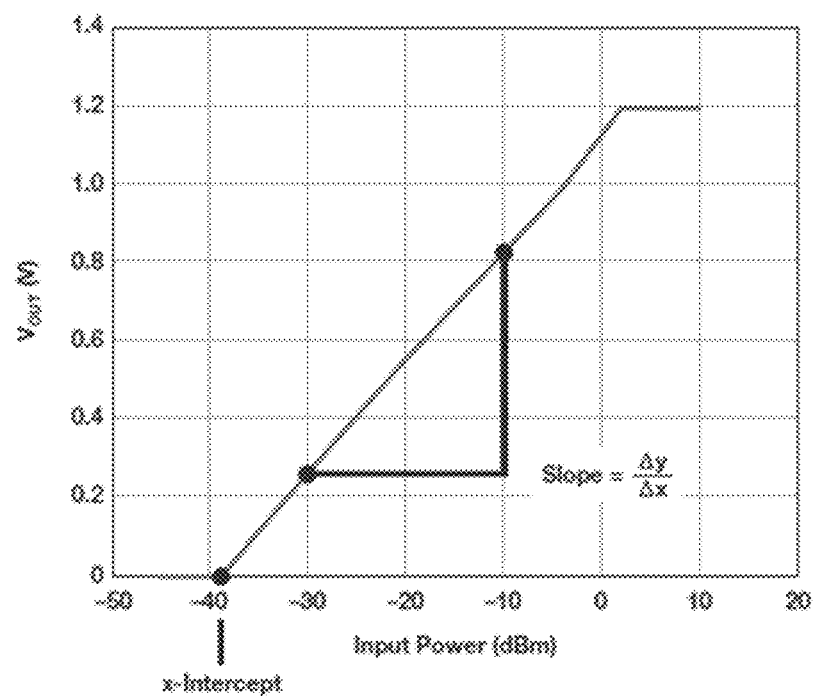
FIG. 5 is a graph of input RF power vs. output voltage.

FIG. 5 is a plot of the output voltage Vout in volts (vertical axis) versus RF Input Power in dBm (horizontal axis). The output voltage is a representation of the input power to the RF Detector. For Example, an input power of −10 dBm will produce a voltage of 0.8V. A threshold is to implement the safety features at a voltage level >0.06V, representing an input power between −30 and −40 dBm.

Different locations were tested for the waveguide. These locations include the rear lobe, side lobes, and main lobe of the RF Energy. The optimal location for the waveguide shown in FIG. 2 is 3 feet, location in the main lobe.

The above-described embodiments of the present disclosure can be implemented in any of numerous ways. For example, the embodiments may be implemented using hardware, software or a combination thereof. When implemented in software, the software code can be executed on any suitable processor or collection of processors, whether provided in a single computer or distributed among multiple computers. Such processors may be implemented as integrated circuits, with one or more processors in an integrated circuit component. Though, a processor may be implemented using circuitry in any suitable format.

Additionally, or alternatively, the above-described embodiments can be implemented as a non-transitory computer readable storage medium embodied thereon a program executable by a processor for performing a method of various embodiments.

It should be understood that the foregoing description is only illustrative of the present invention. Various alternatives and modifications can be devised by those skilled in the art without departing from the present invention. Accordingly, the present invention is intended to embrace all such alternatives, modifications, and variances that fall within the scope of the appended claims.

What is claimed is:

1. Radio frequency detection circuitry comprising:
   a radio frequency (RF) emitting device;
   a waveguide to receive RF energy emitted by the RF emitting device;
   a power detector to convert RF energy received by the waveguide to a voltage; and
   a safety device that operates if a threshold voltage is detected at the power detector, wherein the safety device is outside of a test chamber indicating that the RF energy is being transmitted within the test chamber.

2. The radio frequency detection circuitry of claim 1, further comprising a voltage reader that reads the voltage at the power detector.

3. The radio frequency detection circuitry of claim 2, further comprising a processor that reads the voltage at the voltage reader and signals the safety device to operate.

4. The radio frequency detection circuitry of claim 1, wherein the safety device is an illuminated sign.

5. The radio frequency detection circuitry of claim 2, wherein the voltage reader is a multimeter.

6. Radio frequency detector for a millimeter wave test chamber, the detector comprising:
   a radio frequency (RF) detector circuit that samples RF energy provided by a waveguide routing the RF energy from a RF emitting device and outputs a voltage to a voltage reader;
   a processor that monitors the voltage and operates a safety device outside of the test chamber indicating that RF energy is being transmitted.

7. The radio frequency detector of claim 6, wherein the waveguide is a SH128-20 WR 28 Waveguide with UG-599/U Flange.

8. The radio frequency detector of claim 6, wherein the RF detector circuit is a LTC5596 Development Board.

9. The radio frequency detector of claim 6, wherein the voltage reader is a multimeter.

10. The radio frequency detector of claim 6, wherein the safety device is an illuminated warning sign.

11. The radio frequency detection circuitry of claim 1, further comprising a multiplexer to control multiple safety devices.

12. The radio frequency detection circuitry of claim 1, wherein the safety device locks a door to the test chamber.

* * * * *